(12) United States Patent
Liu

(10) Patent No.: US 8,674,334 B2
(45) Date of Patent: Mar. 18, 2014

(54) MEMORY ELEMENTS USING SELF-ALIGNED PHASE CHANGE MATERIAL LAYERS AND METHODS OF MANUFACTURING SAME

(71) Applicant: Micron Technology, Inc., Boise, ID (US)

(72) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/889,777

(22) Filed: May 8, 2013

(65) Prior Publication Data

US 2013/0248810 A1    Sep. 26, 2013

Related U.S. Application Data

(60) Division of application No. 13/117,359, filed on May 27, 2011, now abandoned, which is a continuation of application No. 12/400,044, filed on Mar. 9, 2009, now Pat. No. 7,968,862, which is a continuation of application No. 11/396,616, filed on Apr. 4, 2006, now Pat. No. 7,812,334.

(51) Int. Cl.
*H01L 29/04* (2006.01)

(52) U.S. Cl.
USPC .......... 257/3; 257/4; 257/5; 257/42; 257/246; 257/E45.002

(58) Field of Classification Search
USPC .............................. 257/2–5, 42, 246, E45.002
See application file for complete search history.

(56) References Cited

U.S. PATENT DOCUMENTS

| | | | | |
|---|---|---|---|---|
| 6,992,365 B2 * | 1/2006 | Xu et al. | | 257/529 |
| 6,995,388 B2 * | 2/2006 | Hwang et al. | | 257/4 |
| 7,326,952 B2 * | 2/2008 | Lowrey | | 257/3 |
| 7,348,590 B2 | 3/2008 | Happ | | |
| 7,504,653 B2 | 3/2009 | Lung | | |
| 7,560,723 B2 | 7/2009 | Liu | | |
| 7,589,344 B2 | 9/2009 | Sato | | |
| 7,663,137 B2 * | 2/2010 | Campbell | | 257/5 |
| 7,791,058 B2 | 9/2010 | Liu | | |

(Continued)

FOREIGN PATENT DOCUMENTS

EP    1 677 372 A1    7/2006
JP    2003/115574 A    4/2003

(Continued)

OTHER PUBLICATIONS

Notification of Transmittal of International Search Report and Written Opinion of the International Searching Authority issued Oct. 31, 2007, International Search Report and Written Opinion.

*Primary Examiner* — Daniel Luke
*Assistant Examiner* — Joseph C Nicely
(74) *Attorney, Agent, or Firm* — Dickstein Shapiro LLP

(57) ABSTRACT

A memory element and method of forming the same. The memory element includes a substrate supporting a first electrode, a dielectric layer over the first electrode having a via exposing a portion of the first electrode, a phase change material layer formed over sidewalls of the via and contacting the exposed portion of the first electrode, insulating material formed over the phase change material layer and a second electrode formed over the insulating material and contacting the phase change material layer.

11 Claims, 15 Drawing Sheets

(56) References Cited

U.S. PATENT DOCUMENTS

| | | |
|---|---|---|
| 2003/0047762 A1 | 3/2003 | Lowrey |
| 2003/0047765 A1* | 3/2003 | Campbell ............... 257/298 |
| 2003/0209728 A1 | 11/2003 | Kozicki et al. |
| 2003/0209746 A1 | 11/2003 | Horii |
| 2004/0124503 A1 | 7/2004 | Harshfield |
| 2005/0032319 A1* | 2/2005 | Dodge ..................... 438/293 |
| 2005/0104231 A1 | 5/2005 | Chiang et al. |
| 2005/0212037 A1 | 9/2005 | Pinnow et al. |
| 2005/0265072 A1 | 12/2005 | Hart et al. |
| 2006/0006374 A1 | 1/2006 | Chang |
| 2006/0110878 A1 | 5/2006 | Lung et al. |
| 2006/0175599 A1 | 8/2006 | Happ |
| 2006/0208847 A1 | 9/2006 | Lankhorst et al. |
| 2007/0018149 A1 | 1/2007 | Sato |
| 2007/0096074 A1* | 5/2007 | Asano et al. ................ 257/4 |
| 2009/0057645 A1 | 3/2009 | Kostylev et al. |
| 2010/0118594 A1 | 5/2010 | Hush |
| 2010/0187492 A1* | 7/2010 | Lee ............................ 257/3 |
| 2010/0230653 A1 | 9/2010 | Chen |

FOREIGN PATENT DOCUMENTS

| | | |
|---|---|---|
| JP | 2006/019688 A | 1/2006 |
| JP | 2007/035683 A | 2/2007 |
| WO | WO-2004/057676 A2 | 7/2004 |
| WO | WO-2004/057676 A3 | 7/2004 |

* cited by examiner

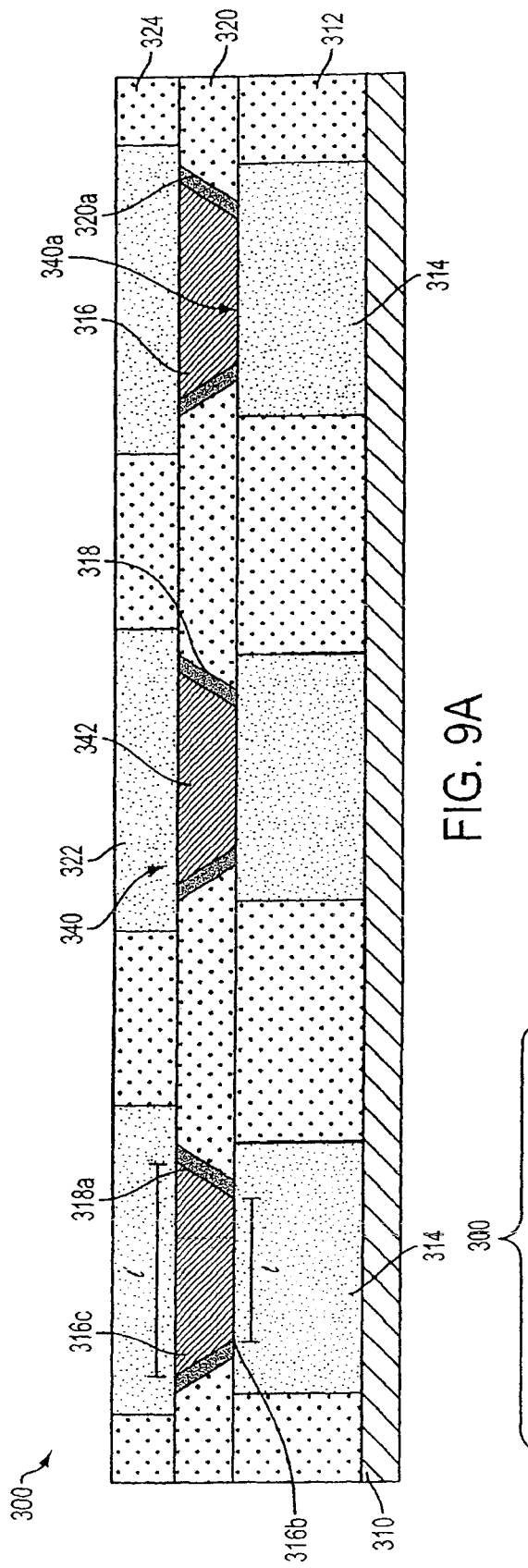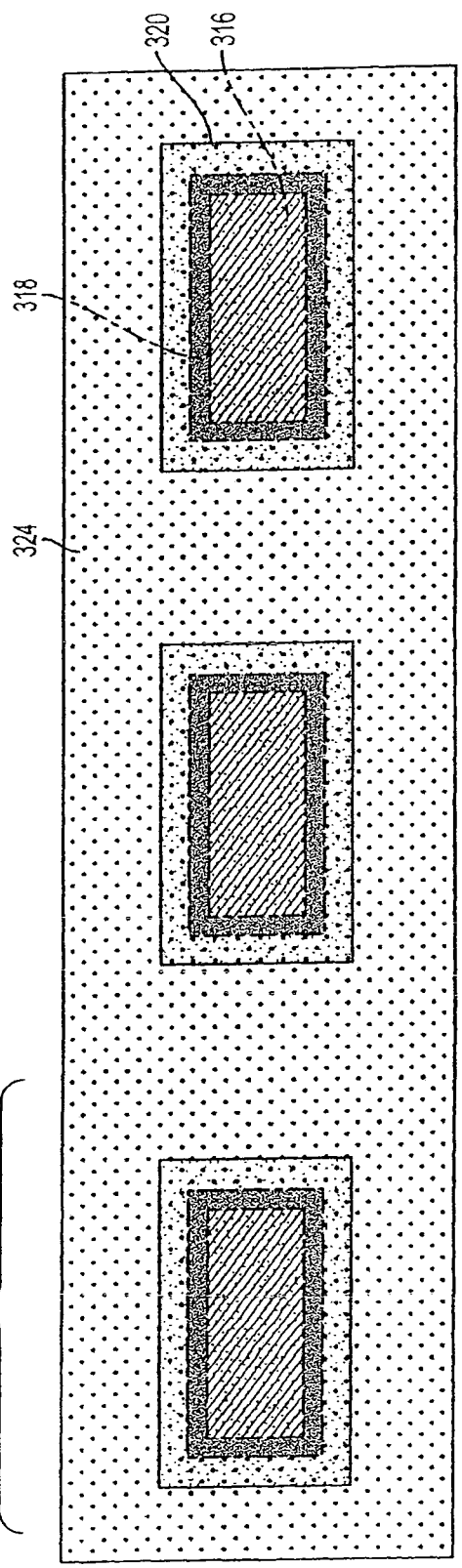

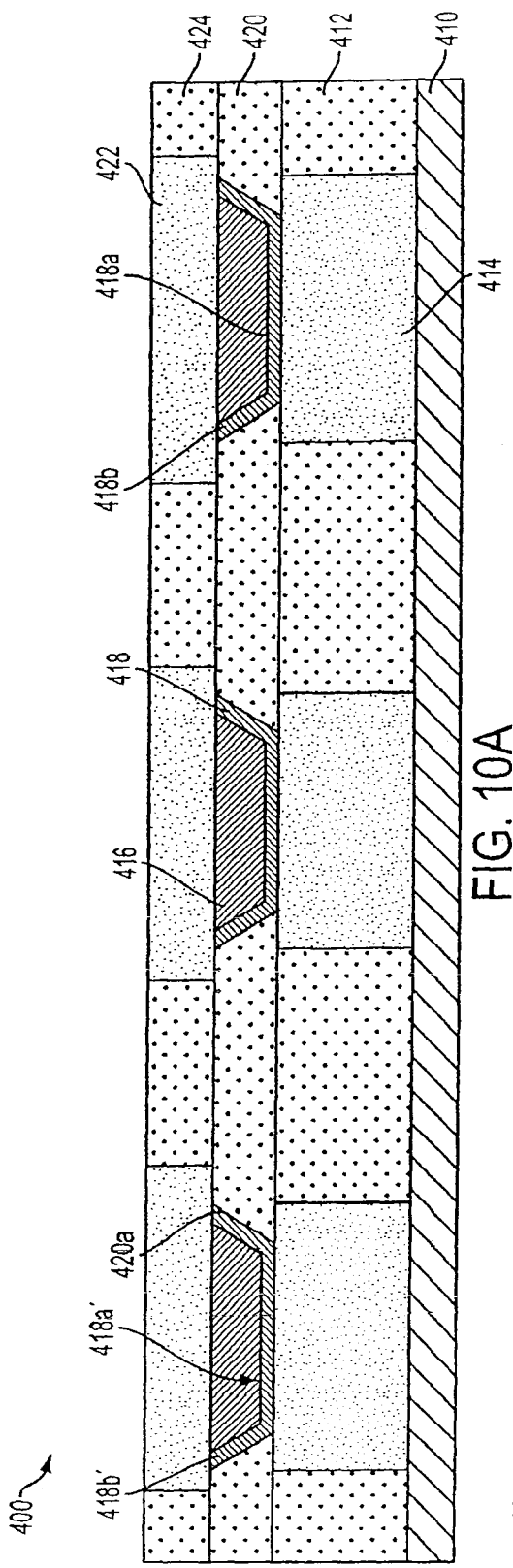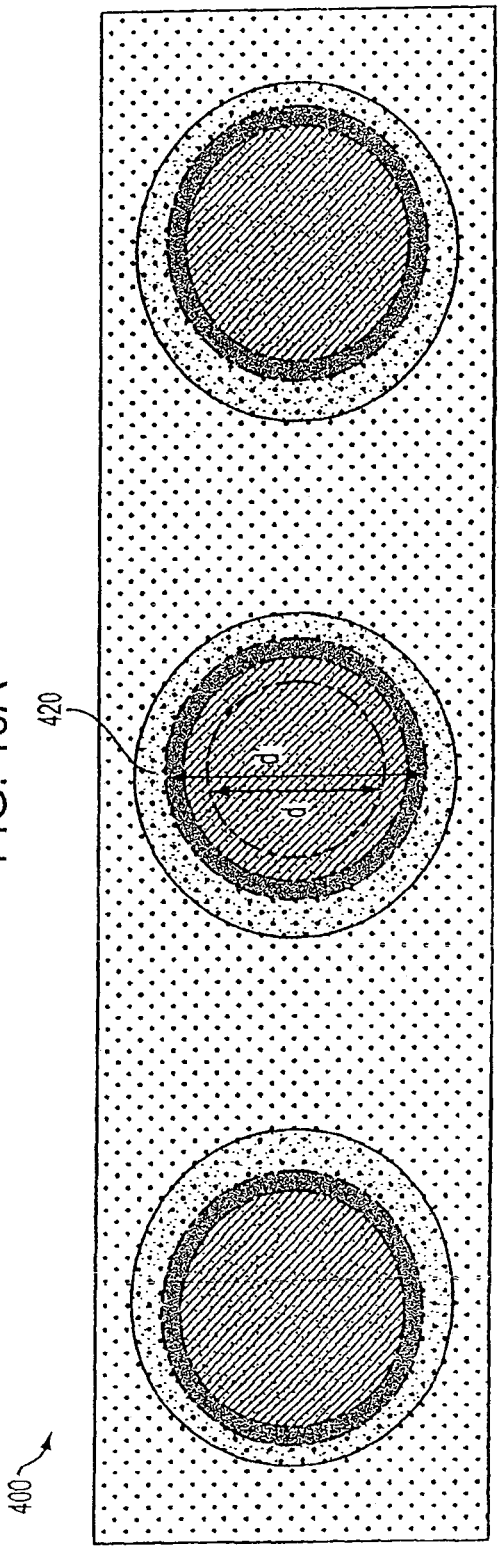
FIG. 10A
FIG. 10B

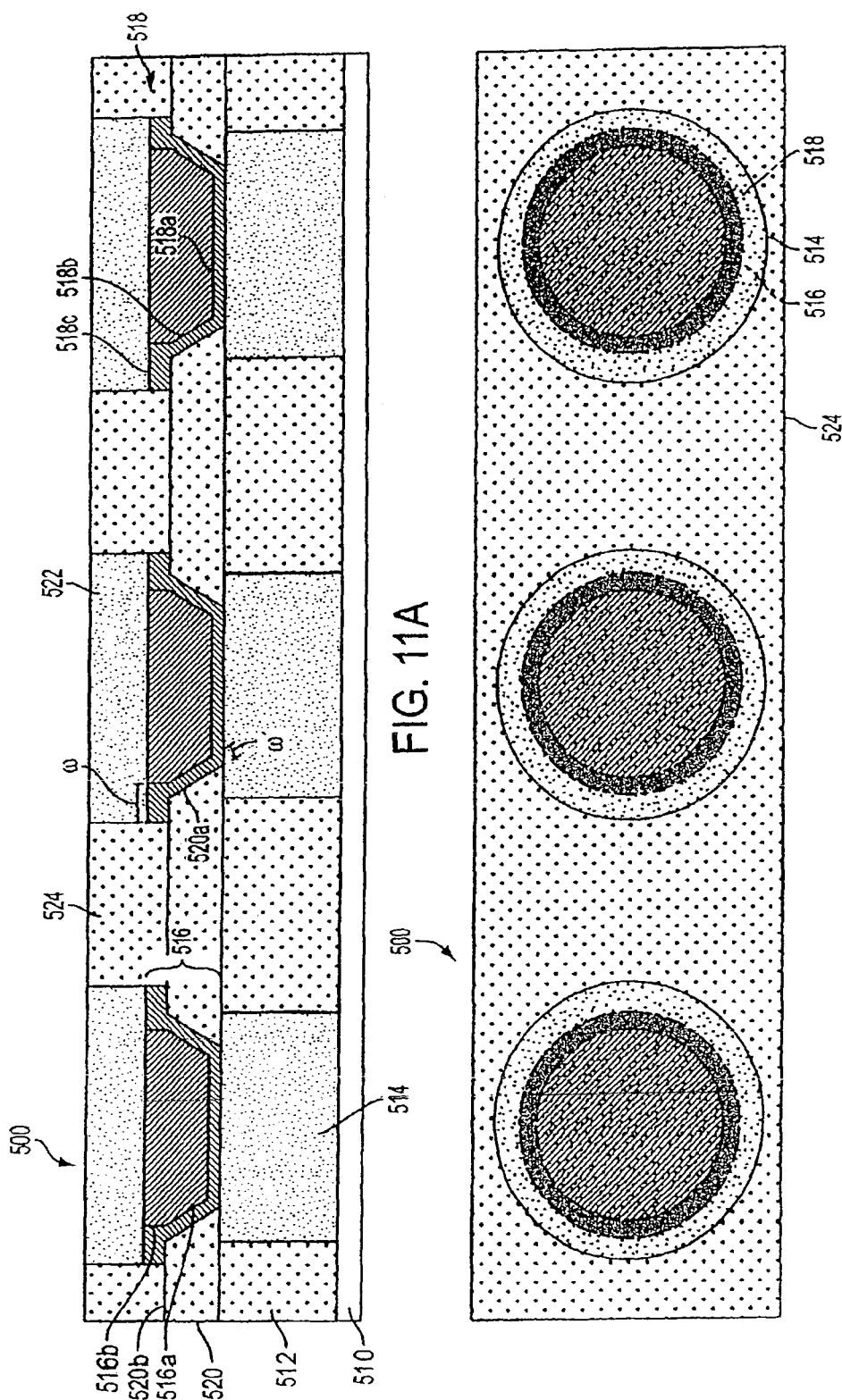

MEMORY ELEMENTS USING SELF-ALIGNED PHASE CHANGE MATERIAL LAYERS AND METHODS OF MANUFACTURING SAME

CROSS REFERENCE TO RELATED APPLICATIONS

The present application is a divisional of U.S. patent application Ser. No. 13/117,359, filed May 27, 2011, which is a continuation of U.S. application Ser. No. 12/400,044, filed Mar. 9, 2009, now U.S. Pat. No. 7,968,862, issued Jun. 28, 2011, which is a continuation of U.S. application Ser. No. 11/396,616, filed Apr. 4, 2006, now U.S. Pat. No. 7,812,334, issued Oct. 10, 2010, the entirety of which are incorporated herein by reference.

FIELD OF THE INVENTION

The present invention relates to semiconductor devices, and in particular to phase change memory elements and methods of forming and using the same.

BACKGROUND OF THE INVENTION

Non-volatile memories are important elements of integrated circuits due to their ability to maintain data absent a power supply. Phase change materials have been investigated for use in non-volatile memory cells. Phase change memory elements include phase change materials, such as chalcogenide alloys, which are capable of stably transitioning between amorphous and crystalline phases. Each phase exhibits a particular resistance state and the resistance states distinguish the logic values of the memory element. Specifically, an amorphous state exhibits a relatively high resistance, and a crystalline state exhibits a relatively low resistance.

A conventional phase change memory element 1, illustrated in FIGS. 1A and 1B, has a layer of phase change material 8 between first and second electrodes 2, 4, which are supported by a dielectric material 6. The phase change material 8 is set to a particular resistance state according to the amount of current applied by the first and second electrodes 2, 4. To obtain an amorphous state (FIG. 1B), a relatively high write current pulse (a reset pulse) is applied through the conventional phase change memory element 1 to melt at least a portion of the phase change material 8 covering the first electrode 2 for a first period of time. The current is removed and the phase change material 8 cools rapidly to a temperature below the crystallization temperature, which results in the portion of the phase change material 8 covering the first electrode 2 having the amorphous phase. To obtain a crystalline state (FIG. 1A), a lower current write pulse (a set pulse) is applied to the conventional phase change memory element 1 for a second period of time (typically longer in duration than the first period of time and crystallization time of amorphous phase change material) to heat the amorphous portion of the phase change material 8 to a temperature below its melting point, but above its crystallization temperature. This causes the amorphous portion of the phase change material 8 to re-crystallize to the crystalline phase that is maintained once the current is removed and the conventional phase change memory element 1 is cooled. The phase change memory element 1 is read by applying a read voltage which does not change the phase state of the phase change material 8.

A sought after characteristic of non-volatile memory is low power consumption. Often, however, conventional phase change memory elements require large operating currents. It is therefore desirable to provide phase change memory elements with reduced current requirements. For phase change memory elements, it is necessary to have a current density that will heat the phase change material past its melting point and quench it in an amorphous state. One way to increase current density is to decrease the size of a first electrode. These methods maximize the current density at the first electrode interface to the phase change material. Although these conventional solutions are typically successful, it is desirable to further reduce the overall current in the phase change memory element, thereby reducing power consumption in certain applications.

Another desired property of phase change memory is its switching reliability and consistency. Conventional phase change memory elements (e.g., phase change memory element 1 of FIGS. 1A and 1B) have programmable regions of the phase change material layer that are not confined, and have the freedom to extend sideways and the interface between the amorphous portions and crystalline portions of the phase change material may cause reliability issues. The proposed inventions confines the cell so that it reduces the ability to have sideway extension during the change from crystalline to amorphous phases or inadvertent failure.

BRIEF SUMMARY OF THE INVENTION

Exemplary embodiments of the invention provide phase change memory elements and methods of forming the same. An exemplary memory element includes a substrate supporting a first electrode. An insulating material element is positioned over the first electrode, and a phase change material layer is formed over the first electrode and surrounding the insulating material element such that the phase change material layer has a lower surface that is in electrical communication with the first electrode. The memory element also has a second electrode in electrical communication with an upper surface of the phase change material layer.

BRIEF DESCRIPTION OF THE DRAWINGS

The foregoing and other advantages and features of the invention will become more apparent from the detailed description of exemplary embodiments provided below with reference to the accompanying drawings in which:

FIGS. 9A-9B illustrate partial cross-sectional and partial top-down views, respectively, of an array phase change memory elements constructed in accordance with a third exemplary embodiment of the invention;

FIGS. 10A-10B illustrate partial cross-sectional and partial top-down views, respectively, of an array phase change memory elements constructed in accordance with a fourth exemplary embodiment of the invention;

FIGS. 11A-11E illustrate partial cross-sectional and partial top-down views of an array phase change memory elements constructed in accordance with a fifth exemplary embodiment of the invention and an exemplary method of fabricating the fifth exemplary embodiment.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures, including those made of semiconductors other than silicon. When reference is made to a semiconductor substrate or wafer in the following description, previous process steps may have been utilized to form regions or junctions in or over the base semiconductor or foundation. The substrate also need not be semiconductor-based, but may be any support structure suitable for supporting an integrated circuit, including, but not limited to, metals, alloys, glasses, polymers, ceramics, and any other supportive materials as is known in the art.

Figure 2A:
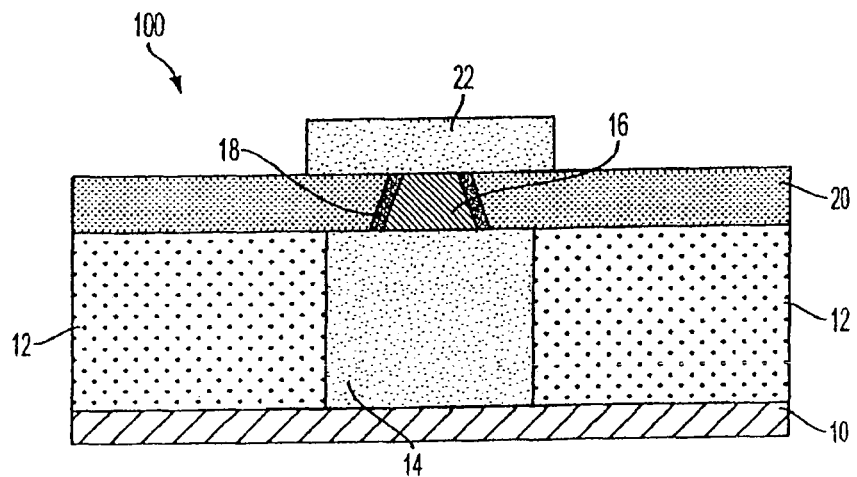
FIGS. 2A-2B illustrate partial cross-sectional and partial top-down views, respectively, of a phase change memory element constructed in accordance with an exemplary embodiment of the invention.
Figure 2B:
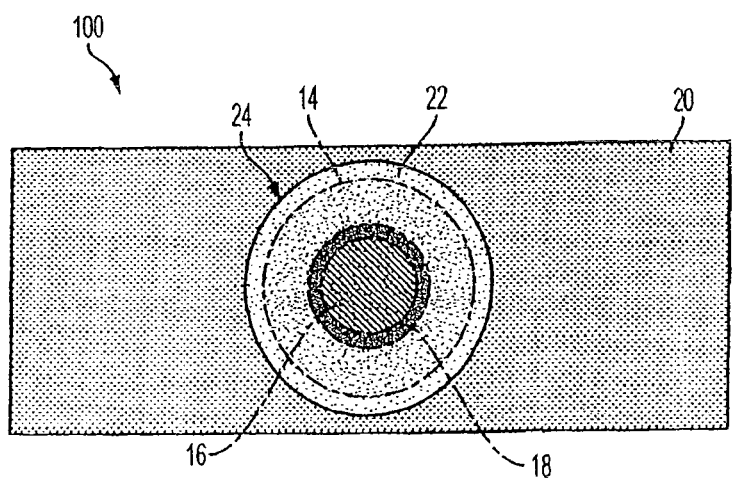

The invention is now explained with reference to the figures, which illustrate exemplary embodiments and throughout which like reference numbers indicate like features. FIGS. 2A and 2B illustrate an exemplary embodiment of a phase change memory element 100 constructed in accordance with the invention.

The phase change memory element 100 includes a substrate 10 having a first dielectric layer 12 formed thereon, and a first electrode 14 formed in a via 24 within the first dielectric layer 12. The phase change memory element 100 also includes a nitride element 16 formed over the first electrode 14, and within a phase change material layer 18 that surrounds the nitride element 16. The phase change material layer 18 is itself surrounded by a second dielectric layer 20. The FIG. 2A phase change memory element 100 also includes a second electrode 22 formed over the nitride element 16 and in electrical communication with the phase change material layer 18.

FIG. 2B illustrates a partial top-down view of the FIG. 2A phase change memory element 100. As illustrated, the phase change material layer 18 surrounds the nitride element 16. The nitride element 16 and the phase change material layer 18 are formed over the first electrode 14 such that the phase change material layer 18 is in electrical communication with the first electrode 14 (FIG. 2A). The first electrode 14 is formed within a via 24 of the first dielectric layer 12.

In operation, the FIG. 2A and 2B phase change memory element 100 has the advantage of requiring less current (and, therefore, consumes less power) than typical phase change memory elements because of a reduced contact area between the phase change material layer 18 and the first electrode 14 resulting in a reduced volume of programmable phase change material layer 18. The current necessary to change the phase of the programmable volume of the illustrated phase change material layer 18 from crystalline to amorphous is decreased due to the decreased contact area between the phase change material layer 18 and first and second electrodes 14, 22.

For example, conventional phase change memory elements (e.g., conventional phase change memory element 1 of FIG. 1) typically have a phase change material layer with a programmable volume having a diameter of about 75 nm and a height of about 50 nm resulting in a volume of about $2.2 \times 10^5$ nm$^3$. The current necessary to reset the phase change material layer having a contact area of a diameter of about 75 nm ($4.4 \times 10^3$ nm$^2$) and a volume of $2.2 \times 10^5$ nm$^3$ is approximately 2 mA.

Figure 1A:
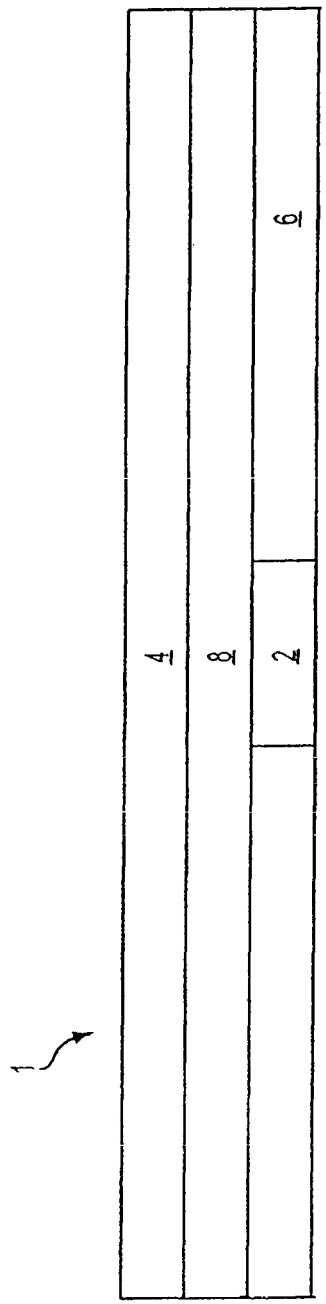
FIGS. 1A-1B illustrate a conventional phase change memory element.
Figure 1B:
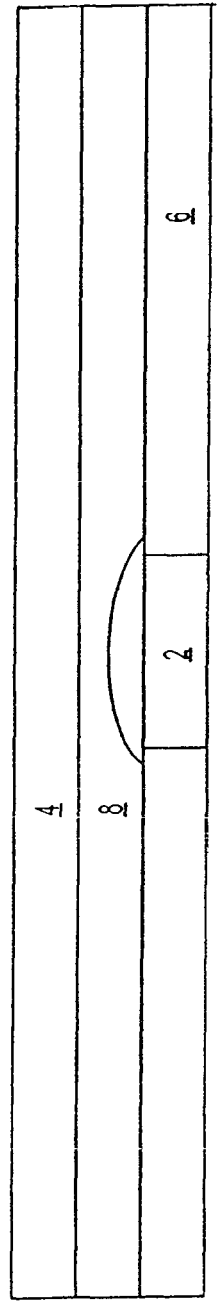

By contrast, the phase change memory element 100 of FIGS. 2A and 2B could have a phase change material layer 18 with a programmable volume of $5.9 \times 10^4$ nm$^3$ if the thickness t (FIG. 4A) of the phase change material layer 18 is about 5 nm and the height h (FIG. 4A) is the same as the programmable volume in the FIG. 1 phase change memory element 1. The phase change memory element 100 of FIGS. 2A and 2B has a programmable volume nearly one quarter the programmable volume of the conventional phase change memory element. The contact area is also reduced to one quarter of the contact area that the conventional phase change material layers (e.g., phase change material layer 8 of FIGS. 1A and 1B) have with first and second electrodes 2, 4 (FIGS. 1A and 1B). The reduction in the contact area and the programmable volume of the phase change material results in a reduction in the amount of current and power necessary to reset the phase change material layer 18. For example, the current necessary to reset the phase change material layer 18 having a contact area of $1.2 \times 10^3$ nm$^2$ and volume of $5.9 \times 10^4$ nm$^3$ is approximately 0.5 mA as compared to the 2 mA necessary to reset the phase change material of a conventional phase change memory element, and the power consumption is also reduced to one fourth of that of a conventional phase change memory element.

The scaling of phase change memory elements indicates that the reset current is approximately proportional to the area of contact between the phase change material and the first and second electrodes (e.g., first and second electrodes 14, 22 of FIG. 2A). Accordingly, the phase change material layer 18 is deposited to surround a nitride element 16, thereby allowing the contact area of the phase change material layer 18 in contact with the first and second electrodes 14, 22 to be smaller than if the nitride element 16 were not provided, and maintaining a reduced volume of phase change material, while the contact area is linearly dependent on the phase change material layer 18 thickness, and can be precisely controlled through the deposition of the phase change material.

FIGS. 3A-5B illustrate an exemplary method of fabricating the phase change memory element 100 illustrated in FIGS. 2A and 2B. No particular order is required for any of the actions described herein, except for those logically requiring the results of prior actions. Accordingly, while the actions below are described as being performed in a specific order, the order is exemplary only and can be altered if desired. Although the formation of a single phase change memory element 100 is shown, it should be appreciated that the phase change memory element 100 can be one memory element in an array of memory elements, which can be formed concurrently.

Figure 3A:
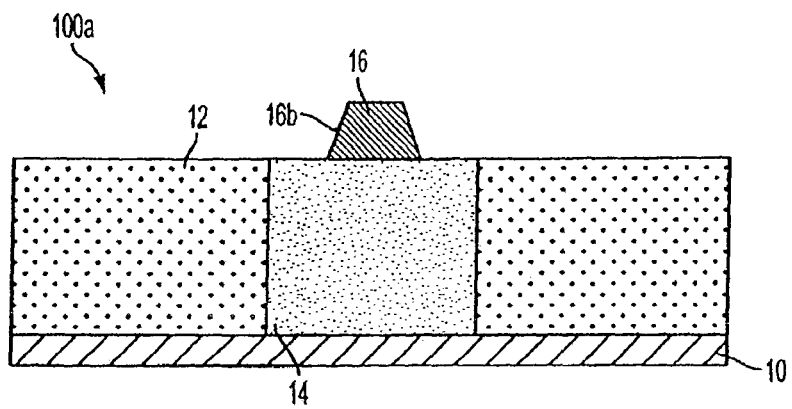
FIGS. 3A-5B illustrate partial cross-sectional and partial top-down views of an exemplary method of fabricating the phase change memory element of FIGS. 2A and 2B.
Figure 3B:
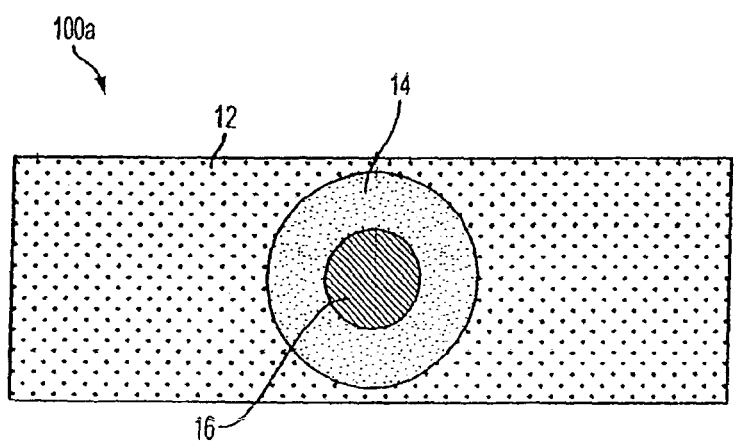

FIGS. 3A and 3B illustrate a partial cross-sectional view and a partial top-down view, respectively, of an intermediate structure 100a. The intermediate structure 100a is formed by providing a first dielectric layer 12 over a substrate 10. The first dielectric layer 12 is typically etched to create vias 24 (FIG. 2B) within which a first electrode 14 is formed. The first electrode 14 can be formed of any suitable conductive material, such as titanium-nitride (TiN), titanium-aluminum-nitride (TiAlN), titanium-tungsten (TiW), platinum (Pt) or tungsten (W), among others.

A nitride element precursor layer is formed and etched to produce a nitride element 16. The nitride element 16 could be patterned to have a substantially disk-like top-down shape (see FIG. 3B) having sloped sidewall regions 16b to improve the step coverage of the phase change material deposition, discussed below. Although element 16 is formed as a nitride, it could be formed of other materials. For example, the element 16 could be formed of any insulating material such as, but limited to, silicon nitrides; alumina oxides; oxides; high temperature polymers; low dielectric materials; insulating glass; or insulating polymers.

It should be noted that the disk-like top-down shape of the nitride element 16 is not intended to be limiting in any way. For example, the nitride element 16 could have a triangular, circular, or rectangular top-down shape, as discussed below with respect to FIG. 9. It should also be noted that the sloped sidewalls 16b are only optional, and that the sidewalls of the nitride element 16 could be vertical relative to a top surface of the first electrode 14, linear, non-linear, bowed, sloped such that a top surface of the nitride element 16 has a greater surface area than that of a bottom surface, or any other desired shape.

Figure 4A:
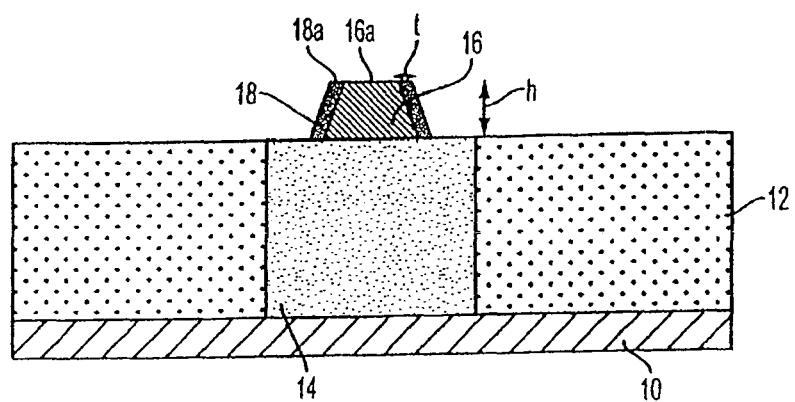
Figure 4B:
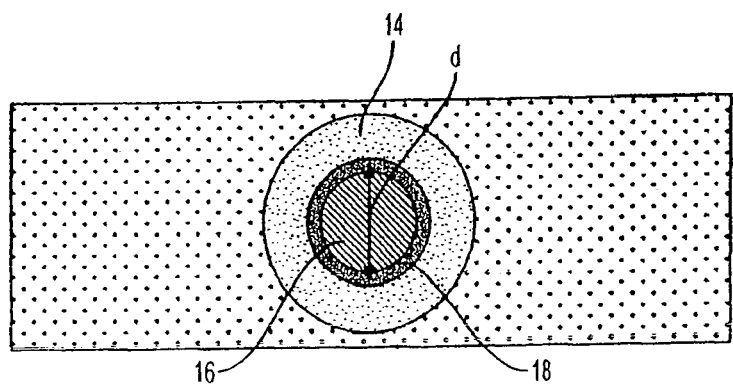

FIGS. 4A and 4B illustrate the deposition of a conformal or a partially conformal phase change material on the sidewalls 16b (FIG. 3A) of the nitride element 16 to form the phase change material layer 18. The deposited phase change material could be a chalcogenide material, such as, for example, germanium-antimony-tellurium or germanium-telluride layer. Exemplary phase change materials may also include, for example, $Ge_xSb_yTe_z$ (e.g., $Ge_2Sb_2Te_5$), GaSb, $Ge_xTe_y$, SbTe (e.g., $Sb_2Te_3$), InSb, InSe, $In_xSb_yTe_z$, $Sn_xSb_yTe_z$, $Ga_x$-$Se_yTe_z$, InSbGe, AgInSbTe, GeSnSbTe, $Te_xGe_ySb_zS_k$ and GeSbSeTe.

The phase change material layer 18 could have an outside diameter d (FIG. 4B) in the range of about 20 nm to about 200 nm, a height h (FIG. 4A) in the range of about 25 nm to about 75 nm, and a cross-sectional thickness t (FIG. 4A) in the range of about 25/ to about 200/. The illustrated phase change material layer 18 has a diameter d of about 75 nm, a height of about 50 nm, and a cross-sectional thickness t of about 50/. The structure parameters are not limited to the above-described values; for example, the parameters can be adjusted for the intended application.

Although, the FIG. 4A phase change material layer 18 has a first surface 18a that is planar to a first surface 16a of the nitride element 16, it is not intended to be limiting in any way. For example, the first surface 16a of the nitride element 16 could be lower than the first surface 18a of the phase change material layer 18, as discussed below with respect to FIG. 6A.

It should also be noted that the phase change material layer 18 need not completely surround the nitride element 16. For example, the phase change material layer 18 could partially surround the nitride element 16 to further reduce the volume of the phase change material layer 18, which may further reduce the current necessary to switch the state of the phase change material layer 18.

Figure 5A:
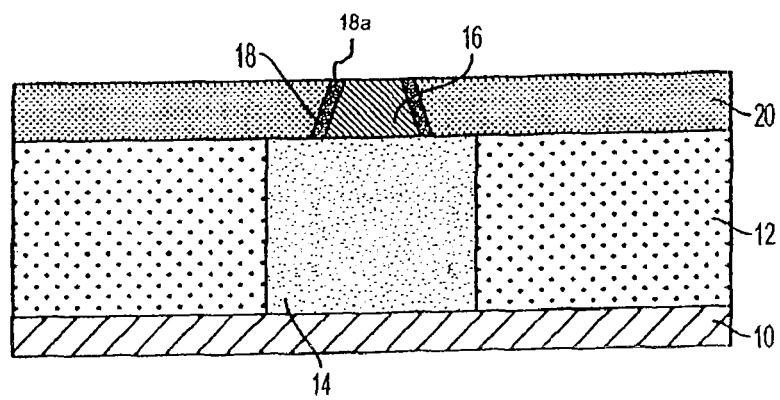
Figure 5B:
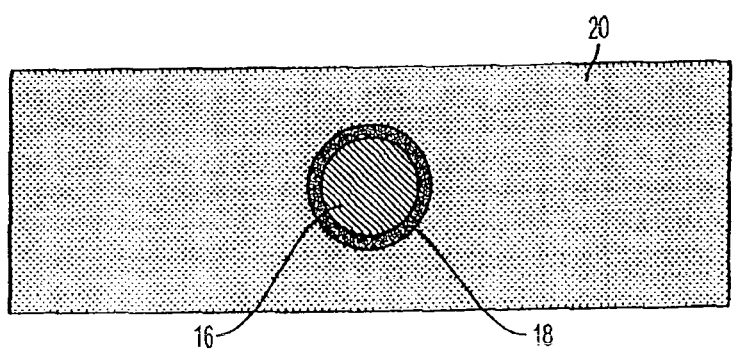

FIGS. 5A and 5B illustrate the deposition of the second dielectric layer 20 over the entire structure illustrated in FIGS. 4A and 4B. The second dielectric layer 20 is subsequently planarized to the level of the upper surface 18a of phase change material layer 18. The second electrode 22 (FIGS. 2A and 2B) is subsequently formed over the phase change material layer 18 and nitride element 16 to form the phase change memory element 100 (FIGS. 2A and 2B).

Although illustrated as forming a single phase change memory element, it should be understood that the illustrations and descriptions are not intended to be limiting in any way. Those skilled in the art will recognize that a plurality of phase change memory elements are typically fabricated on a single substrate simultaneously. A single substrate could contain thousands or millions of phase change memory elements.

The phase change material layer 18 is the active phase change material with a fixed programmable volume that can be set to a crystalline state or reset to an amorphous state by passing a heating current. Since switching the state of the phase change material layer 18 involves a reduced volume of phase change material, the switching stability and consistency as well as cycling lifetime can be improved as the phase state mixing is reduced The thickness of the phase change material layer 18 on the sidewall 16b (FIG. 3A) of the nitride element 16 can be varied, depending on the desired application, to greatly reduce the contact area between phase change material layer 18 and the first and second electrodes 14, 22 (FIGS. 2A and 2B), the programmable current cross-section area, and the programmable volume, thereby resulting in the reduction of the programming current requirement.

It should be noted that although the thickness of the phase change material layer 18 on the sidewall 16b (FIG. 3A) of the nitride element 16 is illustrated as being uniform, it is not intended to be limiting in any way.

Another advantage of the phase change memory element 100 relates to mitigating heat loss. The majority of heat loss in conventional phase change memory elements during the heating process is due to the heat conduction through the first and second electrodes, which have high thermal conductivity; by reducing the contact area between the phase change material layer 18 and the first and second electrodes 14, 22, the amount of heat loss is mitigated to further reduce the programming current.

Yet another advantage of the phase change memory element 100 relates to the self-alignment with which the phase change material layer 18 is deposited. Because the nitride elements 16 are formed over the first electrode 14, the phase change material layer 18 is self-aligned over the first electrode 14 when deposited. The self-alignment of the phase change material layer 18 with the first electrode 14 ensures that there is an electrical communication with both components. The self-alignment of the phase change material layer 18 with the first electrode 14 may simplify the processing and fabrication of the overall phase change memory element 100, and may also increase throughput.

Figure 6A:
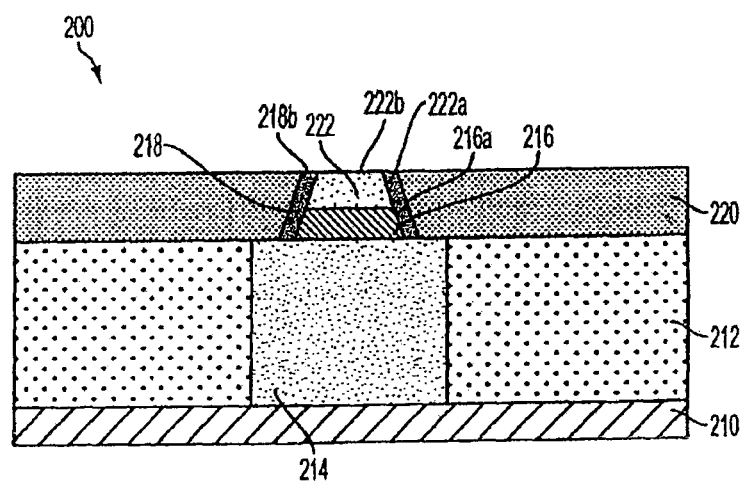
FIGS. 6A-6B illustrate partial cross-sectional and partial top-down views, respectively, of a phase change memory element constructed in accordance with a second exemplary embodiment of the invention.
Figure 6B:
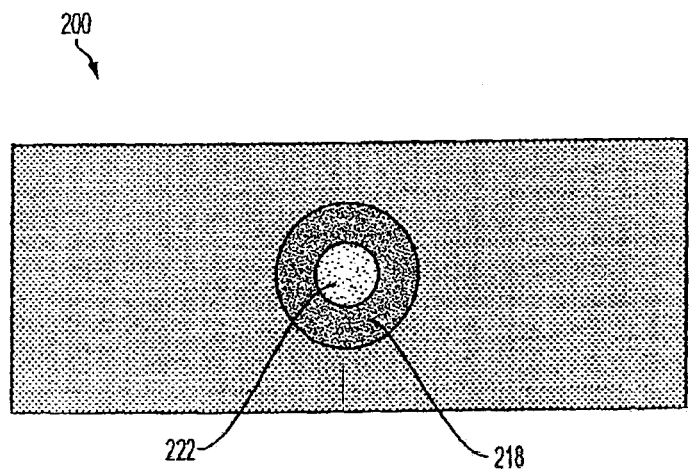
Figure 7A:
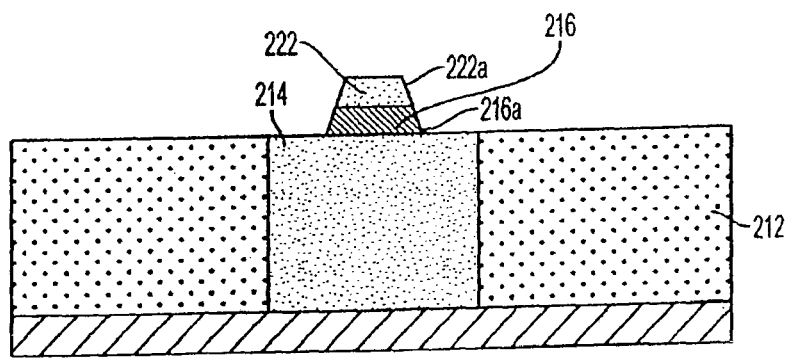
FIGS. 7A-8B illustrate partial cross-sectional and partial top-down views of an exemplary method of fabricating the phase change memory element of FIGS. 6A and 6B.
Figure 7B:
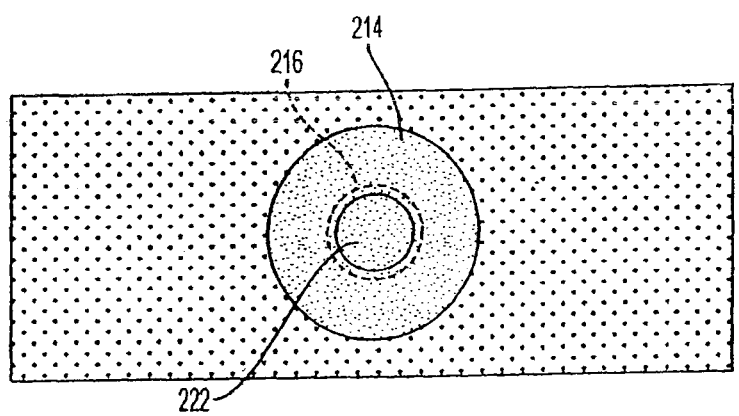

FIGS. 6A and 6B illustrate a second exemplary embodiment of a phase change memory element 200 constructed in accordance with the invention. Specifically, FIGS. 6A and 6B illustrate a partial cross-sectional view and a partial top-down view, respectively, of a phase change memory element 200 having a phase change material layer 218 formed on sidewalls 216a, 222a of a nitride element 216 and a second electrode 222, respectively. Although, the second electrode 222 has a first surface 222b that is planar to a first surface 218b of the phase change material layer 218, it is not intended to be limiting in any way. For example, the second electrode 222 could have a first surface 222b that is lower or higher than that of the first surface 218b of the phase change material layer 218. The phase change material layer 218 is self-aligned over the sidewalls 216a, 222a of the nitride element 216 and the second electrode 222, respectively.

The phase change memory element 200 also includes a first dielectric layer 212 formed over a substrate 210, and has a first electrode 214 formed therein. A second dielectric layer 220 is formed over the first dielectric layer 212 and portions of the first electrode 214.

FIGS. 7A-8B illustrate an exemplary method of fabricating the FIG. 6A and 6B phase change memory element 200 illustrated in FIGS. 6A and 6B. The first dielectric layer 212 is formed over a substrate 210. The first electrode 214 is formed within the first dielectric layer 212. A nitride element 216 is formed between the first electrode 214 and the second electrode 222. As discussed above with respect to FIGS. 3A and 3B, the nitride element 216 could be formed to have a substantially disk-like shape (from a top-down view (FIG. 7B)) having sloped sidewalls 216a for better step coverage of the phase change material deposition. The second electrode 222 is formed over the nitride element 216. The second electrode 222 could also be formed to have a substantially disk-like top-down shape (FIG. 7B) having sloped sidewalls for better step coverage of the phase change material deposition. The materials used to form the nitride element 216 and the second electrode 222 are similar to those discussed above with respect to FIGS. 3A-5B. The nitride element 216 and the second electrode 222 could be formed in situ with one patterning step, although it is not intended to be limiting in any way.

Figure 8A:
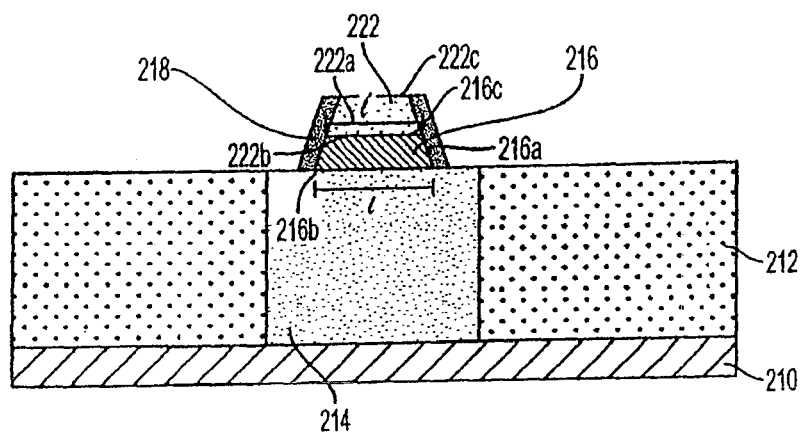
Figure 8B:
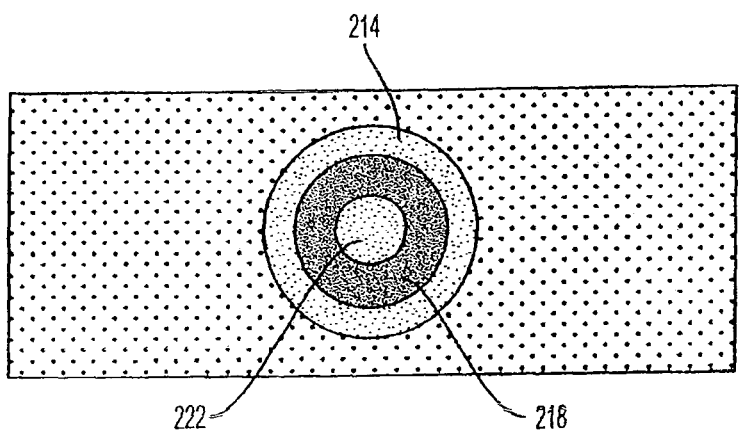

FIGS. 8A and 8B illustrate the deposition of the phase change material layer 218 over the sidewalls 216a, 222a of the nitride element 216 and the second electrode 222, respectively. The phase change material layer 218 could be formed of any material discussed above with respect to FIGS. 4A and 4B. The phase change material layer 218 could be formed to have the same dimensions discussed above with respect to FIGS. 4A and 4B.

The second dielectric layer 220 (FIG. 6A) is subsequently deposited over the first dielectric layer 212 and a portion of the first electrode 214. The phase change memory element 200 (FIG. 6A) has a substantially planar surface, which may further reduce the overall size of the phase change memory element 200. The planar surface may also provide for better handling during subsequent processing steps, and add to the overall robustness of the phase change memory element 200.

Although the nitride element 216 is illustrated as having first surface 216b having a longer length 1 than a second surface 216c of the nitride element 216 having a shorter length 1', it is not intended to be limiting in any way. For example, the second surface 216c of the nitride element 216 could have a length 1' that is equal to or greater than the length 1 of the first surface 216b of the nitride element 216. Additionally, although the sidewalls 216a of the nitride element 216 are illustrated as being substantially linear, it is not intended to be limiting in any way. For example, the sidewalls 216a could be non-linear or have other desired shapes.

Similarly, although the length of a first surface 222b of the second electrode 222 is illustrated as being longer than a length of a second surface 222c, it is not intended to be limiting in any way. For example, the second surface 222c of the second electrode 222 could have a length that is equal to or greater than the length of the first surface 222b of the second electrode 222. Additionally, although the sidewalls 222a of the second electrode 222 are illustrated as being substantially linear, it is not intended to be limiting in any way. For example, the sidewalls 222a could be non-linear or have other desired shapes.

Although illustrated as forming a single phase change memory element 200, it should be understood that the illustrations and descriptions are not intended to be limiting in any way. Those skilled in the art will recognize that a plurality of phase change memory elements are typically fabricated on a single substrate simultaneously. A single substrate could contain thousands or millions of phase change memory elements.

FIGS. 9A and 9B illustrate a plurality of phase change memory elements 300 constructed in accordance with a third exemplary embodiment of the invention. The plurality of phase change memory elements 300 include a phase change material layer 318 formed over sidewalls 320a of a second dielectric layer 320. The second dielectric layer 320 is formed over a first dielectric layer 312 having first electrodes 314 formed over a substrate 310. A nitride element 316 is formed on the sidewalls 318a of the phase change material layer 318. A second electrode 322 is formed over the nitride element 316 and a third dielectric layer 324 is formed between the second electrodes 322.

The FIG. 9A nitride element 316 has first and second surfaces 316b, 316c, respectively, wherein the length 1 of the first surface 316b is shorter than the length 1' of the second surface 316c; however, it is not intended to be limiting in any way. For example, the first surface 316b could have a length longer or equal to the length 1' of the second surface 316c.

The phase change memory elements 300 illustrated in FIGS. 9A and 9B are formed in a substantially similar fashion as the phase change memory element illustrated in FIGS. 2A and 2B. The second dielectric layer 320, however, is formed prior to the formation of the phase change material layer 318 and the nitride element 316. The second dielectric layer is formed over the first dielectric layer 312 and first electrodes 314; the second dielectric layer is then selectively etched to create vias 340 having sloped sidewalls 320a. Conformal or partially conformal phase change material is deposited on the sidewall 320a and bottom 340a portions of the vias 340, and selectively etched to create vias 342 within the phase change material layer 318. The nitride elements 316 are deposited within vias 342, and the entire intermediate structure is planarized. The second electrodes 322 are formed over the phase change material layer 318, and within vias selectively etched into the third dielectric layer 324. Although the vias 342 are illustrated as having a rectangular cross-sectional shape, it is not intended to be limiting in any way; for example, the vias 342 could have additional cross-sectional shapes other than rectangular.

FIGS. 10A and 10B illustrate a plurality of phase change memory elements 400 constructed in accordance with a fourth exemplary embodiment of the invention. The plurality of phase change memory elements 400 include a phase change material layer 418 formed over sidewalls 420a of a second dielectric layer 420, which is formed over a first electrode 414. The first electrodes 414 are formed within a first dielectric layer 412, which is formed over a substrate 410. A second electrode 422 is formed over a nitride element 416 formed over the phase change material layer 418. A third dielectric layer 424 is formed between the second electrodes 422.

The FIG. 10B phase change material layer 418 has a first diameter d corresponding to the diameter as measured across a surface of the phase change material layer 418 nearest the first electrode 414. The phase change material has a second diameter d' corresponding to the diameter as measured across a surface of the phase change material layer 418 nearest the second electrode 422. FIG. 10A illustrates the phase change material layer 418 having a planar portion 418a that is formed over the first electrode and two lateral portions 418b formed over the sidewalls 420a of a second dielectric layer 420. The illustrated phase change material layer 418 has a middle portion 418a that is deposited to coat the area defined by diameter d and has a top surface 418a' that has a height less than a top surface 418b' of the lateral portions 418b of the phase change material layer 418.

The FIG. 1 OA phase change memory elements 400 are formed by providing the second dielectric layer 420, and patterning the dielectric layer 420 such that several vias are formed. A conformal or substantially conformal phase change material is deposited onto the sidewall and bottom regions of the vias to form the phase change material layer 418 followed by the deposition of the nitride elements 416. The entire intermediate structure could be planarized, and a third dielectric layer 424 is deposited and selectively etched to create vias, wherein second electrodes 422 are formed.

FIGS. 11A and 11B illustrate a plurality of phase change memory elements 500 constructed in accordance with a fifth exemplary embodiment of the invention. The plurality of phase change memory elements 500 comprise a phase change material layer 518 formed over sidewalls 520a of a second dielectric layer 520 and formed over a first electrode 514. The phase change memory elements 500 are nearly identical to the phase change memory elements 400 illustrated in FIGS. 10A and 10B; however, sidewalls 518b of the phase change material layer 518 have flared portions 518c, which increase the surface area of the lateral portion 518b that is in proximity to a second electrode 522.

Figure 11C:
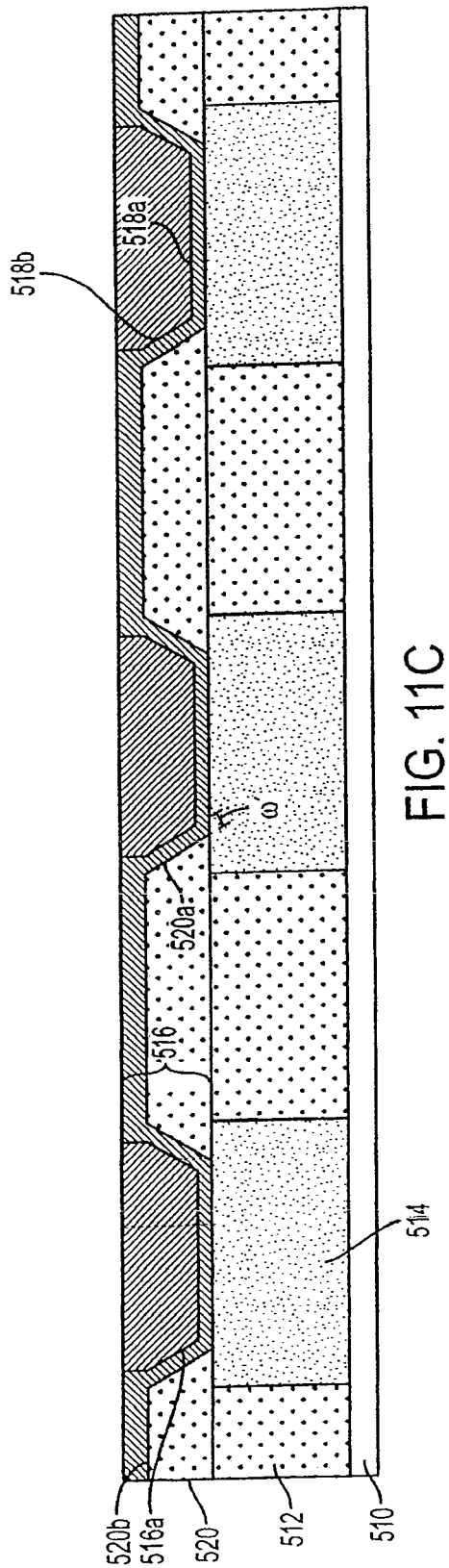
Figure 11D:
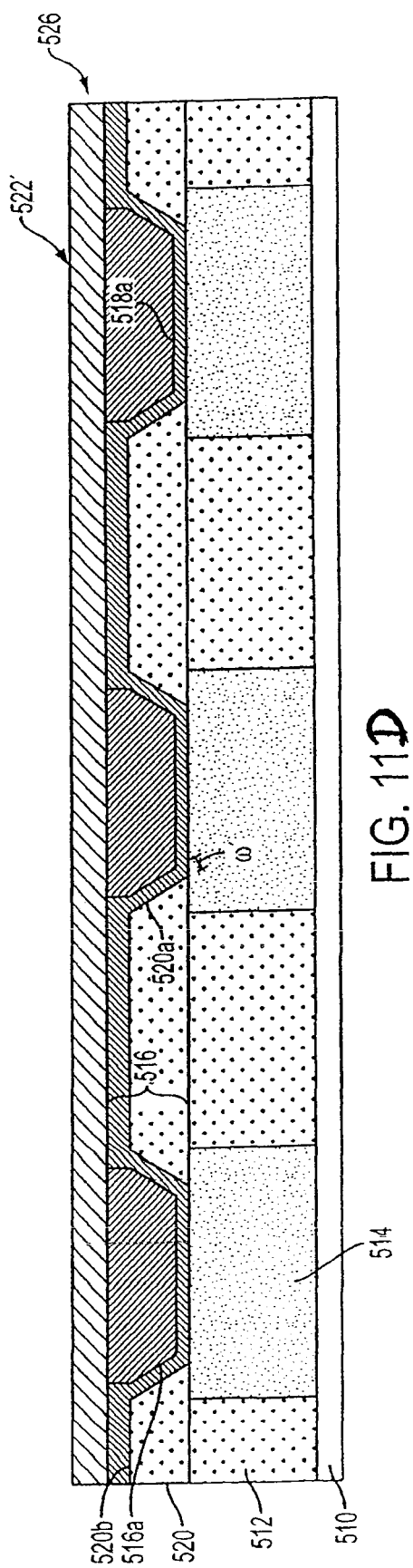
Figure 11E:
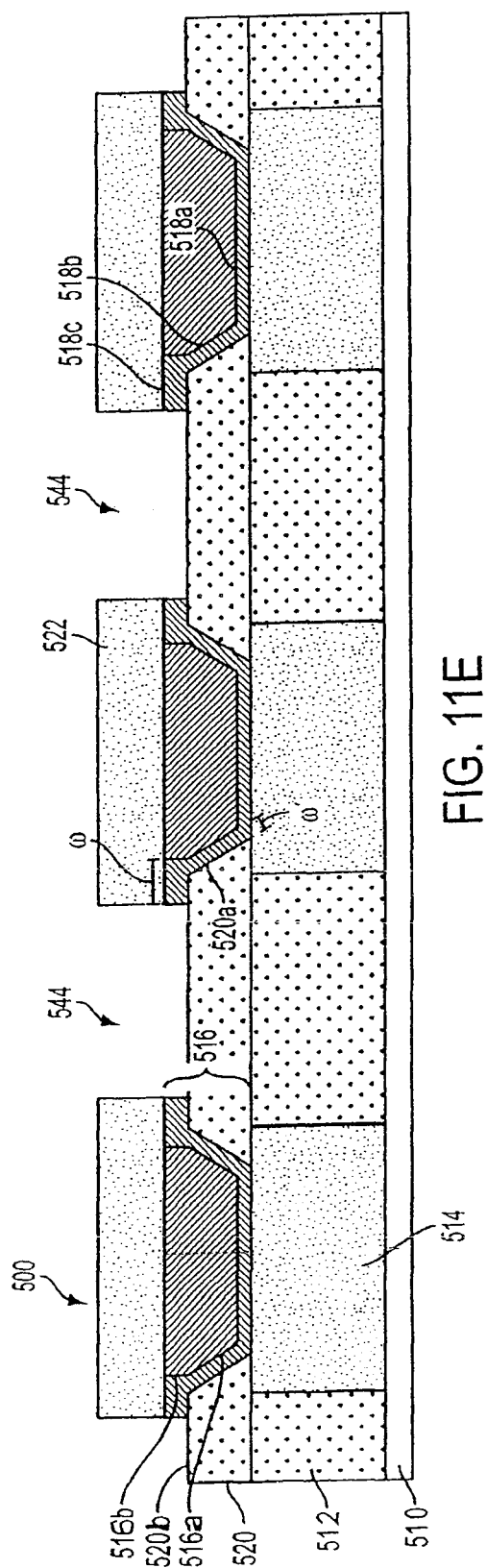

FIGS. 11C-11E illustrate an exemplary method of fabricating the phase change memory element 500 illustrated in FIGS. 11A and 11B. FIG. 11C illustrates a phase change material layer 518 formed such that the phase change material layer 518 has sidewalls 518b, a bottom portion 518b, and flared portions 518c (FIG. 11B) formed over a first surface 520b of the second dielectric layer 520, which collectively form a trench, as illustrated in FIG. 11C. A nitride element 516 is formed within the trench, such that the nitride element 516 is formed on the sidewalls 518a and the bottom portion 518a of the phase change material layer 518.

FIG. 11D illustrates the planarization of the nitride element 516 and the phase change material layer 518, and the deposition of a second electrode precursor material layer 522' formed over the planarized surface 526. Once the second electrode precursor 522' has been deposited, the FIG. 11D structure is selectively etched to form vias 544 to the second dielectric layer 520 illustrated in FIG. 11E. The third dielectric layer 524 (FIG. 11A) is subsequently deposited over the entire FIG. 11E structure.

The FIG. 11A flared portions 518c have a cross-sectional width w greater than the thickness w' of the sidewalls 518b. The greater width w of the flared portions 518c allows for a greater amount of surface area in proximity to the second electrode 522. Therefore, in operation, the current density in the sidewalls 518b is significantly larger than the current density in the flared portions 518c to ensure only the sidewalls 518b comprise programmable volume and switches state. The flared portions 518c isolate the programmable volume (the sidewalls 518b) from the electrodes 522 to reduce heat loss to the electrode 522, which may further reduce the current necessary to change the state of sidewalls 518b.

Figure 12:
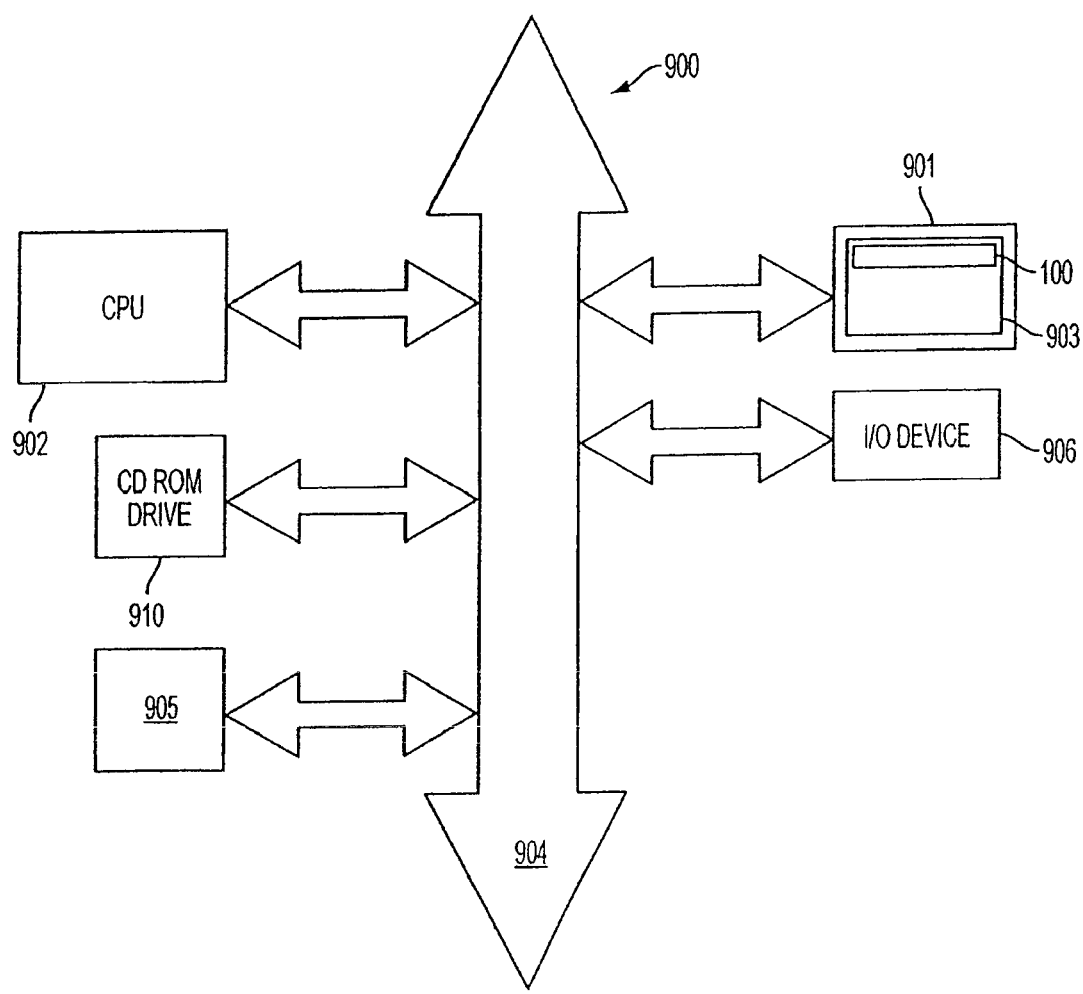
FIG. 12 is a block diagram of a processor system having a memory device incorporating a phase change memory element constructed in accordance with an exemplary embodiment of the invention.

FIG. 12 illustrates a simplified processor system 900 which includes a memory circuit 901 having a phase change memory elements 100 constructed in accordance with the invention as described above with respect to FIGS. 2A-11B (e.g., phase change memory element 100, 200, 300, 400, 500).

The FIG. 12 processor system 900, which can be any system including one or more processors, for example, a computer system, generally comprises a central processing unit (CPU) 902, such as a microprocessor, a digital signal processor, or other programmable digital logic devices, which communicates with an input/output (I/O) device 906 over a bus 904. The memory circuit 901 communicates with the CPU 902 over bus 904 typically through a memory controller.

In the case of a computer system, the processor system 900 may include peripheral devices such as a compact disc (CD) ROM drive 910, which also communicate with CPU 902 and hard drive 905 over the bus 904. Memory circuit 901 is preferably constructed as an integrated circuit, which includes a memory array 903 having at least one phase change memory element 100 according to the invention. If desired, the memory circuit 901 may be combined with the processor, for example CPU 900, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A memory element comprising:
a substrate supporting a first electrode;
a dielectric layer over the first electrode having a via exposing a portion of the first electrode;
a phase change material formed over sidewalls of the via to form a trench within the via, the phase change material contacting the exposed portion of the first electrode and extending above a top of the via;
an insulating material formed over the phase change material and completely filling the trench; and
a second electrode formed over the insulating material and contacting the phase change material.

2. The memory element of claim 1, wherein the phase change material layer has a U-shaped cross section.

3. The memory element of claim 1, wherein the phase change material is conformal.

4. The memory element of claim 1, wherein sidewalls of the phase change material layer have flared portions formed over the top of the via.

5. The memory element of claim 4, wherein the flared portions have a cross-sectional width greater than a thickness of portions of the sidewalls of the phase change material layer proximate the sidewalls of the via.

6. The memory element of claim 4, wherein the second electrode contacts top surfaces of the flared portions.

7. The memory element of claim 1, wherein a surface of the insulating material which is in contact with the second electrode is planar to a surface of the phase change material which is in contact with the second electrode.

8. The memory element of claim 1, wherein the via has first and second lengths.

9. The memory element of claim 8, wherein the first and second lengths are different.

10. The memory element of claim 8, wherein the first length corresponds to a surface in proximity to the first electrode and the second length corresponds to a surface in proximity to the second electrode.

11. The memory element of claim 1, wherein the phase change material is formed of a material selected from the group consisting of germanium-antimony-tellurium, germanium-telluride, GaSb, SbTe, InSb, InSe, $In_xSb_yTe_z$, $Sn_xSb_yTe_z$, $Ga_xSe_yTe_z$, InSbGe, AgInSbTe, GeSnSbTe, $Te_xGe_ySb_zSk$ and GeSbSeTe.

* * * * *